United States Patent [19]
Lee

[11] Patent Number: 4,516,094
[45] Date of Patent: May 7, 1985

[54] ACOUSTIC SURFACE WAVE DEVICE

[75] Inventor: Ching W. Lee, Lexington, Mass.

[73] Assignee: GTE Laboratories Incorporated, Waltham, Mass.

[21] Appl. No.: 564,795

[22] Filed: Dec. 23, 1983

[51] Int. Cl.³ .................. H03H 9/64; H03H 9/145
[52] U.S. Cl. .................. 333/194; 310/313 D; 333/151; 333/153; 333/195
[58] Field of Search ................. 333/193–196, 333/150–155, 191; 310/313 R, 313 A, 313 B, 313 C, 313 D

[56] References Cited
U.S. PATENT DOCUMENTS 4,196,407  4/1980  Masaie et al. .................. 333/191
4,258,342  3/1981  Miyajima et al. ............. 333/194 X

FOREIGN PATENT DOCUMENTS 63920    4/1982  Japan .................. 333/196
69919    4/1982  Japan .................. 333/194
1386243  3/1975  United Kingdom .... 333/153

Primary Examiner—Marvin L. Nussbaum
Attorney, Agent, or Firm—David M. Keay

[57] ABSTRACT

An acoustic surface wave device having a pair of attenuating transducers positioned between the input transducer and the output transducer. Each attenuating transducer has two sets of interleaved electrodes which are connected together by a thin film resistor. The attenuating transducers are spaced apart so that their reflected signals are 180° out of phase, and thus tend to cancel each other. The attenuating transducer arrangement increases the insertion loss of the device and consequently suppresses triple transit signals in the device.

8 Claims, 3 Drawing Figures

ACOUSTIC SURFACE WAVE DEVICE

BACKGROUND OF THE INVENTION

This invention relates to acoustic surface wave devices. More particularly, it is concerned with acoustic surface wave devices employed as filters.

Acoustic surface wave devices employing piezoelectric materials having suitable properties for propagating surface waves and having transducers for launching and receiving acoustic surface waves in the material are well known. Typically, the transducers are arrays of interleaved conductive electrodes deposited on a substrate of the material. In response to electrical signals an input or transmitting transducer launches acoustic surface waves along a predetermined path on the surface of the substrate. An output or receiving transducer detects the acoustic waves and generates electrical signals in response thereto. Typically, acoustic surface wave devices have been employed as delay lines and as filters. Because of the frequency response which can be obtained in an acoustic surface wave device by suitably designing the configuration of the transducer electrodes, particularly desirable bandpass characteristics can be achieved for use of the device as a filter.

In the development of acoustic surface wave devices for use as filters various problems have been encountered. Several secondary effects are present which tend to degrade the performance of the device. Various techniques have been employed to compensate for or avoid certain of these secondary effects. One significant problem of acoustic surface wave devices is the presence of "triple transit signals" which result from the interaction between the input and output transducers. In response to the receipt of acoustic energy from the input transducer, the output transducer causes a fraction of the energy to be directed back toward the input transducer. The input transducer re-transmits a portion of this energy to the output transducer. Thus, a greatly reduced but nevertheless noticeable echo signal is received by the output transducer. This signal which transits the distance between the input and output transducer three times distorts the electrical signal produced by the output transducer.

Various techniques have been employed to eliminate or reduce the effects of these triple transit signals. Reflections of acoustic energy from the edges of the electrodes of the transducers can be suppressed by using electrodes having two elements of one-eighth wavelength in width and separation in place of single element electrodes of one-quarter wavelength in width and separation. Other techniques have been devised in attempts to reduce the effects due to the regenerative action of the received energy with the transducers.

One procedure which may be employed to suppress triple transit signals caused by regeneration is to increase insertion loss. Although increasing insertion loss reduces the signal, the additional suppression of the triple transit signal is twice that of the additional insertion loss. A common technique for increasing insertion loss is the mismatching of the electrical impedance of the device. This technique, however, may cause distortion of the signal and is not effective to the reflections caused by the electrode mass loading and impedance discontinuity. In addition, the electrical impedance mismatching must be achieved externally of the acoustic surface wave device by adjusting the values of the components connected thereto.

SUMMARY OF THE INVENTION

An acoustic surface wave device in accordance with the present invention includes an improved arrangement for suppressing triple transit signals by increasing insertion loss. The acoustic surface wave device comprises an acoustic surface wave propagating medium. An input transducer for launching acoustic surface waves along a propagation path in the medium comprises two sets of interleaved electrodes disposed on the surface of the acoustic surface wave propagating medium. The electrodes extend transversely to the propagation path. An output transducer is disposed across the propagation path for receiving and detecting acoustic surface waves propagated along the propagation path from the input transducer. The output transducer comprises two sets of interleaved electrodes disposed on the surface of the acoustic surface wave propagating medium with the electrodes extending transversely to the propagation path. An attenuating transducer is interposed across the propagation path between the input transducer and the output transducer for intercepting and attenuating acoustic surface waves propagated along the propagation path. The attenuating transducer increases the insertion loss of the device thus suppressing the triple transit signal.

For a better understanding of the present invention, together with other and further objects, advantages and capabilities thereof, reference is made to the following disclosure and appended claims in connection with the above-described drawings.

DETAILED DESCRIPTION OF THE INVENTION

Figure 1:
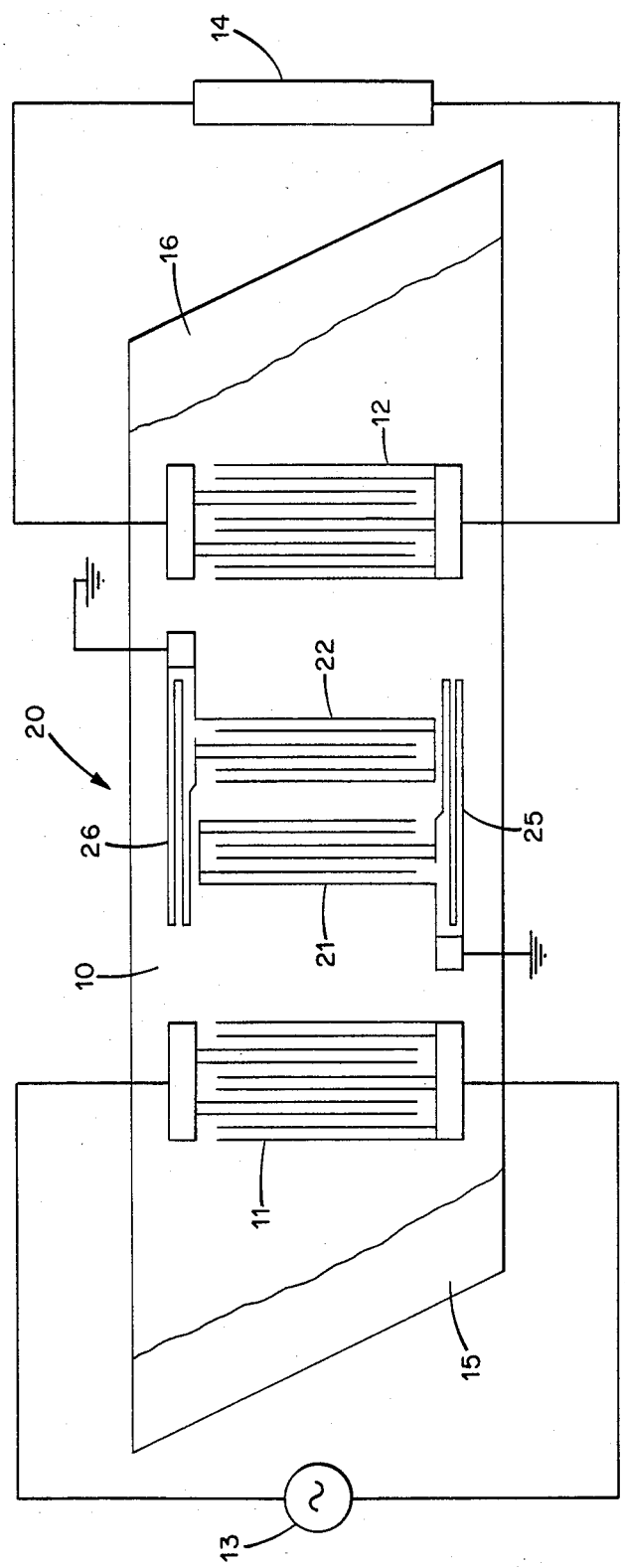
FIG. 1 is a schematic representation of an acoustic surface wave device in accordance with the present invention.

FIG. 1 is a schematic representation of an acoustic surface wave device in accordance with the present invention. The device includes a substrate 10 of a suitable acoustic surface wave propagating material, for example, PZT, lithium niobate, or lithium tantalate. An input or transmitting transducer 11 of conductive material is deposited on the surface of the substrate 10 for launching acoustic surface waves along a propagation path in the substrate. An output or receiving transducer 12 is located across the propagation path in order to receive acoustic surface waves generated by the input transducer 11. A source of electrical signals 13 is connected to the input transducer 11, and the output transducer 12 is connected to a load 14. Two quantities of a suitable acoustic surface wave absorbing material 15 and 16 are located on the substrate 10 near the outer edges in order to absorb extraneous acoustic surface waves and prevent their reflection back toward the transducers.

The input transducer 11 includes two sets of interleaved conductive electrodes deposited on the surface of the substrate 10. As indicated in FIG. 1, each electrode consists of two conductive elements. The source of electrical signal energy 13 is connected across the two sets of electrodes. The input transducer 11 converts electrical energy from the source 13 to mechanical acoustic surface waves which propagate along the propagation path in the medium in a direction transverse to the direction in which the electrodes extend.

The output transducer 12 also includes two sets of interleaved conductive electrodes, each electrode being a double element. The output transducer 12 receives the acoustic surface waves propagated toward it along the propagation path, detects them, and converts them into electrical signals which are applied to the load 14 connected across the two sets of electrodes. As represented, the width of each electrode element and the spacing between adjacent elements is one-eighth of the wavelength of the synchronous frequency of the device.

In accordance with the present invention a transducer attenuator 20 is interposed across the propagation path between the input transducer 11 and the output transducer 12. As illustrated schematically in FIG. 1, the transducer attenuator 20 includes two wide band transducers 21 and 22. Each transducer 21 and 22 includes two sets of interleaved conductive electrodes and, as shown schematically in FIG. 1, each electrode may in include two electrode elements. The two attenuating transducers 21 and 22 are spaced apart so that they are 90° out of phase at the synchronous frequency of the device.

The two sets of interleaved electrodes of the first attenuating transducer 21 are connected together through a resistor 25. Similarly a resistor 26 is connected between the two sets of interleaved electrodes of the second attenuating transducer 22. As illustrated in FIG. 1 provisions may be made to permit connecting one set of electrodes of each of the transducers 21 and 22 to ground. Desirably the resistors may be thin film resistance elements in a filamentary pattern of the same material as the electrodes. The electrodes of all the transducers 11, 12, 21, and 22 and the resistors 25 and 26 may all be formed simultaneously by employing known techniques of depositing and etching conductive material, specifically aluminum.

The two attenuating transducers 21 and 22 of the transducer attenuator 20 are arranged 90° out of phase at the synchronous frequency of the device. That is, the distance between them is an integral number of wavelengths plus one-quarter wavelength. Thus, acoustic surface waves reflected from the two transducers 21 and 22 are 180° out of phase and tend to cancel each other. Although only one pair of attenuating transducers 21 and 22 is illustrated, several pairs may be employed. The number of pairs of attenuating transducers and the values of the thin film resistors are selected so as to provide the desired insertion loss and thus suppress the triple transit signal to the desired level.

The signal dissipated by each of the attenuating transducers 21 and 22 is evaluated by its insertion loss at the synchronous frequency of the device, which is expressed as:

$$L(f_o) = -10 \log_{10} \frac{2 Q_L Q_R}{(Q_L + Q_R) + \alpha Q_L^2 Q_R^2}$$

where
$$Q_L = 2\pi f_o C_T R_L,$$

$$Q_R = \frac{1}{2\pi f_o C_T R_a},$$

$f_o$ is the synchronous frequency, $\alpha = 0$ or 1 for tuned or untuned transducers, respectively, $C_T$ is the transducer capacitance, $R_a$ is the transducer radiation resistance, and $R_L$ is the load resistance which is related to the metal thin film as:

$$R_L = \rho L/A$$

L and A are the length and cross sectional area, respectively, of the metal film and $\rho$ is the sheet resistivity. For aluminum, $\rho \simeq 0.028264$ ohm-mm²/m.

In one specific embodiment devices as illustrated schematically in FIG. 1 were fabricated employing a substrate of 128° YX lithium niobate. The devices were designed to operate at a synchronous frequency of 36.15 MHz having a wavelength of 109.3 μm in the substrate. The input transducer 11 and the output transducer 12 were the same and were separated at about 2.09 mm. Each transducer had nine pairs of uniformly overlapping electrodes, each electrode being a double element one-eighth of a wavelength wide and the elements being separated by one-eighth of a wavelength. Each of the attenuating transducers 21 and 22 had four pairs of uniformly overlapping electrodes, each electrode element being a double element one-eighth of a wavelength wide and the elements being separated by one-eighth of a wavelength. The two attenuating transducers 21 and 22 were separated by a distance so as to be 90° out of phase at the synchronous frequency of the device. The thin film resistors 25 and 26 were each about 125 ohms. The attenuating transducers 21 and 22 were grounded as shown in the schematic illustration of FIG. 1 so as to serve as shields eliminating electromagnetic feedthrough from the input transducer 11 to the output transducer 12.

Figure 2A:
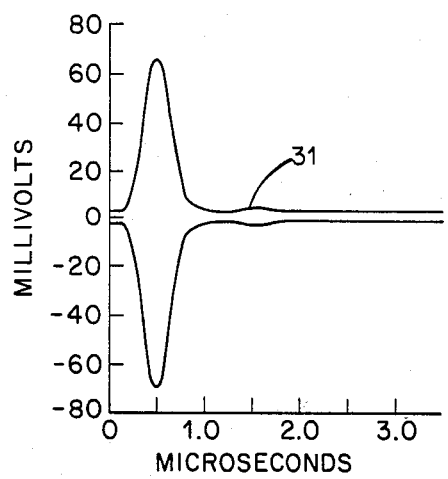
FIG. 2A is a curve illustrating the impulse response of the acoustic surface wave device of FIG. 1.
Figure 2B:
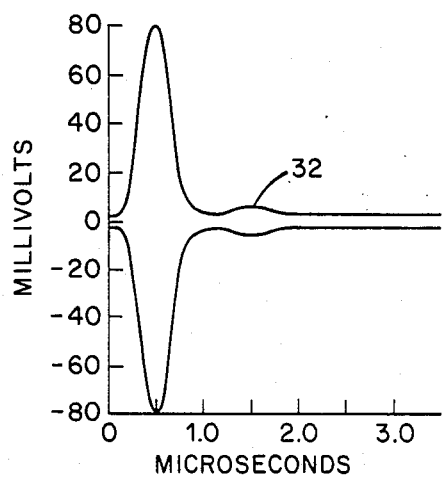
FIG. 2B is a curve illustrating the impulse response of an acoustic surface wave device which is similar to that of FIG. 1, but does not employ an attenuating transducer.

FIG. 2A is a curve illustrating the response of a device in accordance with the specific embodiment as described to a single narrow pulse. FIG. 2B illustrates the response of a device which was essentially the same except that the transducer attenuator 20 was not present. The transit time of each acoustic surface wave through the propagating medium from the input transducer to the output transducer was approximately 0.5 microseconds as indicated by the center of the primary output pulses. Thus, the triple transit signal produced by each pulse occurred at approximately 1.5 microseconds as shown at points 31 and 32 in FIGS. 2A and 2B, respectively. The attenuating transducer arrangement produced a 2 dB insertion loss and a 4 dB triple transit signal suppression in addition to that produced in the device without the attenuating transducers, which device had approximately 29 dB of triple transit signal suppression.

While there has been shown and described what is considered a preferred embodiment of the present invention, it will be obvious to those skilled in the art that various changes and modifications maybe made therein without departing from the invention as defined by the appended claims.

What is claimed is:

1. An acoustic surface wave device comprising an acoustic surface wave propagating medium;

an input transducer for launching acoustic surface waves along a propagation path in said medium, the input transducer comprising two sets of interleaved electrodes disposed on the surface of the acoustic surface wave propagating medium with the electrodes extending transversely to the propagation path;

an output transducer across said propagation path for receiving and detecting acoustic surface waves propagated along the propagation path from the input transducer, the output transducer comprising two sets of interleaved electrodes disposed on the surface of the acoustic surface wave propagating medium with the electrodes extending transversely to the propagation path;

a first attenuating transducer interposed across said propagation path between the input transducer and the output transducer for intercepting and attenuating acoustic surface waves propagated along said propagation path; and a second attenuating transducer interposed across said propagation path between the input transducer and the output transducer for intercepting and attenuating acoustic surface waves propagated along said propagation path;

said first attenuating transducer and said second attenuating transducer being spaced apart by a distance so as to reflect acoustic surface waves along said propagation path 180° out of phase at the synchronous frequency of the device.

2. An acoustic surface wave device in accordance with claim 1 wherein each of said first and second attenuating transducers comprises two sets of interleaved electrodes disposed on the surface of the acoustic surface wave propagating medium with the electrodes extending transversely to the propagation path.

3. An acoustic surface wave device in accordance with claim 2 including a first resistance element connected between the two sets of interleaved electrodes of said first attenuating transducer; and a second resistance element connected between the two sets of interleaved electrodes of said second attenuating transducer.

4. An acoustic surface wave device in accordance with claim 3 wherein each of said first and second resistance elements comprises a pattern of material disposed on the surface of the acoustic surface wave propagating medium.

5. An acoustic surface wave device in accordance with claim 4 wherein each of said electrodes of said first and second attenuating transducers comprises two spaced electrode elements;

each electrode element having a width of approximately one-eighth the wavelength of the synchronous frequency of the device and being spaced from an adjacent electrode element by approximately one-eighth the wavelength of the synchronous frequency of the device.

6. An acoustic surface wave device in accordance with claim 5 wherein each of said electrodes of said input and output transducers comprises two spaced electrode elements;

each electrode element having a width of approximately one-eighth the wavelength of the synchronous frequency of the device and being spaced from an adjacent electrode element by approximately one-eighth the wavelength of the synchronous frequency of the device.

7. An acoustic surface wave device in accordance with claim 6 wherein interleaved electrodes of the input transducer, the output transducer, the first attenuating transducer, and the second attenuating transducer are formed of the same conductive material; and each of said first and second resistance elements comprises a filamentary pattern of said conductive material.

8. An acoustic surface wave device in accordance with claim 7 including means for connecting one set of interleaved electrodes of each of said first and second attenuating transducers to ground.

* * * * *